United States Patent [19]

Frass et al.

[11] Patent Number: 4,482,444

[45] Date of Patent: Nov. 13, 1984

[54] PROCESS FOR ELECTROCHEMICALLY MODIFYING ELECTROCHEMICALLY ROUGHENED ALUMINUM SUPPORT MATERIALS AND THE USE OF THESE MATERIALS IN THE MANUFACTURE OF OFFSET PRINTING PLATES

[75] Inventors: Werner Frass, Wiesbaden; Dieter Mohr, Römerberg, both of Fed. Rep. of Germany

[73] Assignee: Hoechst Aktiengesellschaft, Frankfurt am Main, Fed. Rep. of Germany

[21] Appl. No.: 504,874

[22] Filed: Jun. 16, 1983

[30] Foreign Application Priority Data

Jun. 19, 1980 [DE] Fed. Rep. of Germany ....... 3222967

[51] Int. Cl.[3] ........................ C25F 3/04; C25D 11/16; B41N 1/08; G03F 7/02

[52] U.S. Cl. .............................. 204/129.35; 101/459; 101/467; 204/129.4; 204/129.75; 204/33; 204/DIG. 8; 430/302

[58] Field of Search ..................... 101/459, 457, 463.1, 101/467; 204/33, 38 A, 58, 140, 129.35, 129.1, 204/129.75, 129.4, 129.8, DIG. 8; 430/302, 278

[56] References Cited

U.S. PATENT DOCUMENTS

| | | | |
|---|---|---|---|
| 3,160,506 | 12/1964 | O'Connor et al. | 96/33 |
| 3,929,591 | 12/1975 | Chu et al. | 204/17 |
| 3,935,080 | 1/1976 | Gumbinner et al. | 204/28 |
| 4,242,417 | 12/1980 | Huang | 428/457 |
| 4,324,841 | 4/1982 | Huang | 428/457 |
| 4,437,955 | 3/1984 | Shaffer | 204/129.4 |

FOREIGN PATENT DOCUMENTS

| | | | |
|---|---|---|---|
| 2250275 | 4/1974 | Fed. Rep. of Germany | 204/129.4 |
| 2557222 | 6/1977 | Fed. Rep. of Germany | |
| 2537724 | 2/1981 | Fed. Rep. of Germany | |
| 2537725 | 2/1981 | Fed. Rep. of Germany | |
| 3036174 | 4/1981 | Fed. Rep. of Germany | |
| 2420704 | 6/1981 | Fed. Rep. of Germany | |
| 3009103 | 9/1981 | Fed. Rep. of Germany | |
| 3127329 | 5/1982 | Fed. Rep. of Germany | |
| 56-15396 | 2/1981 | Japan | 101/459 |

OTHER PUBLICATIONS

European Search Report.

*Primary Examiner*—Howard S. Williams
*Assistant Examiner*—T. L. Williams
*Attorney, Agent, or Firm*—Schwartz, Jeffery, Schwaab, Mack, Blumenthal & Koch

[57] ABSTRACT

This invention pertains to a process for electrochemically modifying electrochemically roughened aluminum or aluminum alloy-based support materials for printing plates. An aluminum or aluminum alloy-based support material is electrochemically roughened using alternating current in an electrolyte containing at least one from the group consisting of hydrochloric acid and nitric acid. Subsequently, at least one surface of the material is treated in an aqueous electrolyte, with the roughened material being made the cathode. The cathodic treatment results in removal of material from the surface in the order of from 0.1 to 10 g/m$^2$, and is carried out in an aqueous electrolyte which has a pH value in the range from 3 to 11 and includes at least one water-soluble salt in a concentration ranging from 5 g/l up to the saturation limit thereof. The cathodic treatment is appropriately conducted using direct current at a current density from 3 to 100 A/dm$^2$, at a temperature from 15° to 90° C., and for a duration from 5 to 90 seconds. The removal of material is optionally followed by an anodic oxidation of the support material and a hydrophilizing post-treatment of the oxide layer.

Support materials which have been prepared in this manner are used in the manufacture of offset printing plates carrying a radiation-sensitive coating.

10 Claims, No Drawings

PROCESS FOR ELECTROCHEMICALLY MODIFYING ELECTROCHEMICALLY ROUGHENED ALUMINUM SUPPORT MATERIALS AND THE USE OF THESE MATERIALS IN THE MANUFACTURE OF OFFSET PRINTING PLATES

BACKGROUND OF THE INVENTION

The present invention relates to a process for electrochemically modifying aluminum or aluminum alloy-based support materials for printing plates, which previously have been electrochemically roughened, and to the use of the materials thus modified in the manufacture of offset printing plates.

Support materials for offset printing plates are provided, on one or both sides, with a radiation-sensitive (light-sensitive) coating (copying or reproduction coating), either directly by the user or by the manufacturer of precoated printing plates, this coating permitting the production of a printing image (printing form) by a photomechanical process. Following the production of the printing form, the coating support carries the printing image areas and, simultaneously, forms, in the areas which are free from an image (non-image areas), the hydrophilic image background for the lithographic printing operation.

The following requirements must, among others, be met by a support for a radiation-sensitive material of this type used in the manufacture of lithographic plates:

Those portions of the radiation-sensitive coating which are comparatively more soluble following irradiation must be capable of being easily removed from the support, by a developing operation, in order to produce the hydrophilic non-image areas without leaving a residue.

The support, which has been laid bare in the non-image areas, must possess a high affinity for water, i.e., it must be strongly hydrophilic, in order to accept water, rapidly and permanently, during the lithographic printing operation, and to exert an adequate repelling effect with respect to the greasy printing ink.

The photosensitive coating must exhibit an adequate degree of adhesion prior to exposure, and those portions of the coating which print must exhibit adequate adhesion following exposure.

The support material should possess a good mechanical stability, for example, against abrasion and a good chemical resistance, particularly with respect to alkaline media.

Water requirement during printing should be as low as possible, for example, to prevent excessive moistening of the paper because, otherwise, "register difficulties" in color work (i.e. the second or third color shade can no longer be printed in register upon the first color shade) or breaks in the paper web in rotary offset printing may occur.

In order to meet some of these requirements, support materials of aluminum, which are conventionally employed in practice, are, first of all, subjected to a mechanical, chemical and/or electrochemical roughening treatment, which additionally may be followed by an anodic oxidation of the roughened aluminum surface. Particularly, electrochemically roughened aluminum surfaces with their very fine-grained structure forming an interface between the support material and the radiation-sensitive coating of printing plates, produce, in the printing forms which can be manufactured from these plates, results which meet practical requirements and which already comply with most of the demands. Water requirements during printing are, however, often still too high in the support materials which have been roughened and optionally anodically oxidized according to known processes. Modifications of these processes have, therefore, already been described which especially may be applied after the roughening step and which, for example, include the following processes:

German Offenlegungsschrift No. 3,009,103 (equivalent to South African Pat. No. 81/1545) discloses an abrasive modification of electrochemically roughened support materials for printing plates comprising aluminum. In this modifying treatment, an abrasive removal of material from the surface in the order of from 0.4 to 3.0 g/m$^2$ is effected under the action of an aqueous-alkaline solution which has a pH value exceeding 11. Printing plates manufactured from support materials which have been thus modified and optionally anodically oxidized, are stated to have a lower consumption of dampening solution and a reduced adsorptivity.

A similar process, especially for manufacturing aluminum support materials for positive-working reproduction coatings in the field of printing plates is described in German Offenlegungsschrift No. 3,036,174 (equivalent to British Pat. No. 2,060,923). In a preferred process variant, the support material is mechanically roughened prior to the electrochemical roughening treatment and the surface which has been roughened in this manner is also abrasively modified using an aqueous acid or base. It is stated that a printing plate produced from this support material shows a long press life, a high resistance to staining in the non-image areas and a uniform roughening structure.

In the method of producing printing plate support materials of aluminum according to German Offenlegungsschrift No. 2,557,222 (similar in content to U.S. Pat. No. 3,935,080), the support material is additionally cathodically modified (cleaned) in an aqueous sulfuric acid, between the step of an electrochemical roughening in an aqueous hydrochloric acid and the step of an anodic oxidation in an aqueous sulfuric acid. It is stated that the method is, in the first place, suitable for use in a continuous process and that it results in a very clean surface.

From the prior art, a cathodic treatment is also known for use in other methods:

According to German Auslegeschrift No. 2,420,704 (equivalent to U.S. Pat. No. 3,865,700) cathodic contacting of aluminum supports is used in the anodic oxidation of these supports in an aqueous sulfuric acid, in order to prevent the use of contact rolls, which are normally present.

German Pat. No. 2,537,724 (equivalent to British Pat. No. 1,532,303) discloses a one-step roughening process without subsequent abrasive modification of the surface, in which aluminum support materials for printing plates are electrochemically treated in agitated aqueous salt solutions having a salt concentration of at least 200 g/l, a pH value ranging from 5 to 8 and a temperature of less than 60° C. The salts used are alkali metal salts, alkaline earth metal salts or ammonium salts of hydrohalogenic acids or oxo-acids of nitrogen or of halogens. In a process variant (resulting in surfaces of type A), the aluminum can be roughened, in a cathodic circuit arrangement, for a duration from 30 to 60 seconds with direct current of 70 to 150 A/dm$^2$, whereby a silvery surface with a dull finish is produced; in this variant, alkali metal salts are exclusively used. Similarly, German Pat. No. 2,537,725 (equivalent to British Pat. No. 1,532,304) describes a possible cathodic circuit arrangement for the roughening of aluminum, in which the aqueous electrolyte, at a pH value ranging from 1 to 5, must contain an alkali metal salt in addition to aluminum salts.

It is true that a chemical or electrochemical modification of electrochemically roughened support materials for printing plates in aqueous acids produces a good cleaning effect on the surfaces thus treated. A marked reduction in the consumption of dampening solution of the printing forms manufactured from such supports is, however, not noticed and, in addition, an adverse influence on the printing run occasionally may be observed with this type of treatment. A chemical modification of electrochemically roughened support materials for printing plates in aqueous-alkaline solutions may often fulfill the above-outlined practical requirements demanded of a printing plate, but it has, nevertheless, some technological disadvantages. Due to the abrasive removal of aluminum and the generation of $Al(OH)_4^-$ or $AlO(OH)_2^-$ ions connected therewith, the amount of $OH^-$ ions in the solution is constantly reduced, which causes a change in the concentration of $OH^-$ ions in the aqueous-alkaline solution and, as a result of the known inhibiting effect of the aluminate produced, leads to losses of action of the bath and, consequently, to short useful lives of the modifying solution. Monitoring the process to obtain unchanging product characteristics is, naturally, rendered difficult by such concentration variations and also by temperature variations which occur. In addition, the disposal of the relatively aggressive aqueous-alkaline modifying solutions after use thereof is not without problems from the point of view of preventing water pollution.

SUMMARY OF THE INVENTION

It is therefore an object of the present invention to provide a process for manufacturing support materials for printing plates, which leads to modified surfaces which are distinguished by an improved "ink-water balance" and reduced abrasion during printing, without adversely influencing the adhesion of the copying coating.

The invention is based on the known process for electrochemically modifying at least one surface of electrochemically roughened, aluminum or aluminum alloybased support materials for printing plates in an aqueous electrolyte, in which the roughened material is made the cathode. In the process of the invention, electrochemical modification comprises an abrasive removal of material from the surface, in the order of from 0.1 to 10 g/m$^2$, carried out in an aqueous electrolyte which has a pH value ranging from 3 to 11 and comprises at least one water-soluble salt in a concentration from 5 g/l up to the saturation limit thereof.

DETAILED DESCRIPTION OF PREFERRED EMBODIMENTS

In preferred embodiments, the electrolyte has a pH value ranging from 5 to 9, an electrochemical removal of material from the surface is effected in the order of from 0.5 to 5 g/m$^2$ and the electrolyte comprises at least one watersoluble salt in a concentration from 10 to 250 g/l. The process conditions are appropriately chosen in such a way that the electrochemical modification is carried out using direct current at a current density in the range from 3 to 100 A/dm$^2$, particularly from 10 to 80 A/dm$^2$, at a temperature in the range from 15° to 90° C., particularly from 20° to 40° C. and for a duration from 5 to 90 seconds, particularly from 10 to 60 seconds; the corresponding voltage ranges from 5 to 60 V, particularly from 10 to 40 V. Values for the electrochemical removal of material between 0.1 and 0.5 g/m$^2$ already may lead to certain improvements of the surface, but their effect is generally still insufficient. Values in excess of 5 g/m$^2$ possibly may be too high, this applies in particular, for those cases in which the preceding roughening treatment was conducted to be rather shallow, i.e. to give relatively low peak-to-valley roughnesses. The process may be performed discontinuously, however, it is preferably continuously conducted in a modern strip processing installation.

For the aqueous electrolyte used in the cathodic modification process of the invention, any water soluble salts are, in principle, suitable, which increase the conductivity of water to a sufficient degree and the cations of which, under the conditions employed, do not interact with the aluminum which is made the cathode, in such a way that the redox products are deposited thereupon. In order to obtain a conductivity which is suitable for practical purposes, it is preferable to use alkali metal salts, alkaline earth metal salts or aluminum salts of hydrohalogenic acids, and also of the oxo-acids of halogens, carbon, boron, nitrogen, phosphorus, and sulfur or of the fluorine-containing acids of boron, silicon, phosphorus, and sulfur, either alone or combined with one another. Included are, in particular, the Na, K or Mg salts of hydrochloric acid, chloric acid, nitric acid, sulfuric acid, phosphoric acid, fluoboric acid or fluosilicic acid, particularly preferably the chlorides or nitrates. As the electrolyte, the aqueous solutions of the above-specified salts are preferably used, without any additions of acids or bases. If salts are used, the aqueous solutions of which have a pH value which deviates widely from the neutral point, care has to be taken, however, to adjust the pH value of the electrolyte to a value in the vicinity of the neutral point (see the aboveindicated pH ranges), if possible by means of an acid containing the corresponding anion or by means of a base containing the corresponding cation.

From the point of view of production engineering, economy and ecology, the salts used in the electrolyte preferably include those which effect a good conductivity at low concentrations and the aqueous solutions of which already have a pH value close to the neutral point.

It is believed that in the process of the invention, the walls of the pores (cells) which have been generated in the preceding electrochemical roughening treatment are partially abraded and micropores are formed at the bottom of the cells; by influencing the topography in this manner, a less rugged surface is presumably produced. The structure of the surface is clearly distinguishable from a structure resulting from a one step roughening treatment in an aqueous electrolyte which has a pH value within the neutral range.

It is possible that the process of cathodically modifying aluminum surfaces, which have already been electrochemically roughened is, in the first place, determined by the electrical conditions used (current density or voltage, respectively) in connection with the duration of treatment (quantity of charge passed). On this assumption, any other adjustable process parameters, such as, for example, temperature, type of salt, or electrolyte concentration, have only an indirect effect through the influence exerted on the electrical conductivity.

Compared with other processes for the manufacture of support materials for lithographic printing plates, which have hitherto become known, the process of the invention for cathodically modifying aluminum surfaces, which have already been electrochemically roughened, leads to the following advantages:

The lighter support surface yields an improved contrast between image and non-image areas after development.

The roughening structure of increased uniformity without major cavities results in a more exact control of exposure and an improved resolution of the radiation-sensitive coatings on the printing plates.

The less deep surface roughness leads to a reduced consumption of dampening solution during printing and to an increased abrasion resistance of the surface.

Due to the highest possible degree of neutrality of the electrolyte (with respect to the pH value thereof), the uncontrollable, purely chemical attack on the aluminum is presumably negligible so that the modifying abrasive removal of material can be controlled, within wide temperature ranges, essentially through the electrical parameters and the treatment time. It is thus rendered possible to modify support materials for various fields of application, with a view to particular results and without great expenditure.

Because the salt used in the aqueous electrolyte is essentially required only to increase the conductivity of water and is not consumed in the treatment, the bath can be employed for a very long time, without any "topping-up" or purifying operations, i.e., it has a long useful life.

As the metal substrate for the material in the form of a strip, a foil or a sheet, aluminum or an aluminum alloy is used. The following materials (which are also used in the examples which follow) are preferably to be understood by the following:

"Pure aluminum" (DIN Material No. 3.0255), i.e., composed of not less than 99.5% of Al, and the following permissible admixtures (maximum total 0.5%) of 0.3% of Si, 0.4% of Fe, 0.03% of Ti, 0.02% of Cu, 0.07% of Zn, and 0.03% of other substances, or "Al-alloy 3003" (comparable with DIN Material No. 3.0515), i.e., composed of not less than 98.5% of Al, of the alloying constituents Mg, 0 to 0.3%, and Mn, 0.8 to 1.5%, and of the following permissible admixtures of 0.5% of Si, 0.5% of Fe, 0.2% of Ti, 0.2% of Zn, 0.1% of Cu, and 0.15% of other substances.

After a frequently applied cleaning treatment in one of the commercially available "aluminum pickles", the support material is electrochemically roughened, and for this purpose the following methods may be employed, in addition to the conventional methods using alternating current in an aqueous electrolyte containing HCl and/or $HNO_3$:

the roughening of aluminum in a dilute aqueous HCl solution with an addition of further acids, for example, chromic acid or phosphoric acid, according to German Auslegeschrift No. 2,327,764 (equivalent to U.S. Pat. No. 3,887,447), or with an addition of corrosion inhibitors, for example amines, aldehydes, amides, urea or non-ionic surfactants, according to German Auslegeschrift No. 2,218,471, the roughening of aluminum in a dilute aqueous HCl or $HNO_3$ solution using special types of electric current, for example, an alternating current in which the current strength has an anode amplitude which is greater than the cathode amplitude, according to German Auslegeschrift No. 2,650,762 (equivalent to U.S. Pat. No. 4,087,341), the roughening of aluminum in a dilute aqueous HCl or $HNO_3$ solution with an addition of boric acid or borates, according to German Auslegeschrift No. 2,149,899, the roughening of aluminum in a neutral aqueous salt solution having a comparatively high salt concentration, using alternating current or an anodic circuit arrangement, according to German Offenlegungsschrift No. 2,537,724, or the roughening of aluminum in an acidic aqueous aluminum salt solution having a comparatively high salt concentration, using alternating current or an anodic circuit arrangement, according to German Offenlegungsschrift No. 2,537,725.

The process parameters in the roughening step, particularly in a continuous process, are generally within the following ranges: temperature of the electrolyte between 20° and 60° C., concentration of active substance (acid, salt) between 5 and 100 g/l (or even higher, in the case of salts), current density between 15 and 130 A/dm$^2$, dwell time between 10 and 100 seconds and flow rate of the electrolyte on the surface of the workpiece to be treated between 5 and 100 cm/second. The type of current used is in most cases alternating current; it is, however, also possible to use modified current types, e.g. an alternating current with different amplitudes of current strength for the anode and cathode current.

The mean peak-to-valley roughness $R_z$ of the roughened surface is in the range from about 1 to 15 μm, particularly in the range from 3 to 8 μm.

The peak-to-valley roughness is determined according to DIN 4768, in the version dated October 1970, the peak-to-valley roughness $R_z$ is then the arithmetic mean calculated from the individual peak-to-valley roughness values of five mutually adjacent individual measurement lengths. The individual peak-to-valley roughness is defined as the distance of two parallel lines, which contact the highest and lowest points of the roughness profile within the individual measurement lengths, from the median line. The individual measurement length corresponds to one fifth of the length, projected at right angles onto the median line, of that part of the roughness profile, which is directly used for evaluation. The median line is the line which runs parallel to the general direction of the roughness profile having the shape of the geometrically ideal profile and which divides the roughness profile in such a way that the sum of the areas filled with material above it and the sum of the areas free from material below it are equal.

After the cathodic modification step of the invention, which is carried out subsequently to one of the electrochemical roughening processes according to the state of the art, the material is anodically oxidized in a further, preferably employed process step, in order to improve, for example, the abrasion and adhesion properties of the surface of the support material. Conventional electrolytes, such as $H_2SO_4$, $H_3PO_4$, $H_2C_2O_4$, amidosulfonic acid, sulfosuccinic acid, sulfosalicylic acid or mixtures thereof, may be used for the anodic oxidation. By way of example, reference is made to the following standard methods for the use of aqueous electrolytes, containing $H_2SO_4$, for the anodic oxidation of aluminum (note, in this regard, e.g. M. Schenk, "Werkstoff Aluminium und seine anodische Oxydation", i.e., "The Material Aluminum and its Anodic Oxidation", Francke Verlag, Bern, 1948, page 760;"Praktische Galvanotechnik", i.e., "Practical Electroplating", Eugen G. Leuze Verlag, Saulgau, 1970, pages 395 et seq., and pages 518/519; and W. Huebner and C. T. Speiser, "Die Praxis der anodischen Oxidation des Aluminiums", i.e., "Practical Technology of the Anodic Oxidation of Aluminum", Aluminium Verlag, Duesseldorf, 1977, 3rd Edition, pages 137 et seq.):

The direct current sulfuric acid process, in which anodic oxidation is carried out in an aqueous electrolyte which conventionally contains approximately 230 g of $H_2SO_4$ per liter of solution, for 10 to 60 minutes at 10° to 22° C., and at a current density of 0.5 to 2.5 $A/dm_2$. In this process, the sulfuric acid concentration in the aqueous electrolyte solution also can be reduced to 8 to 10% by weight of $H_2SO_4$ (about 100 g of $H_2SO_4$ per liter), or it also can be increased to 30% by weight (365 g of $H_2SO_4$ per liter), or more.

The "hard-anodizing process" is carried out using an aqueous electrolyte, containing $H_2SO_4$ in a concentration of 166 g of $H_2SO_4$ per liter (or about 230 g of $H_2SO_4$ per liter), at an operating temperature of 0° to 5° C., and at a current density of 2 to 3 $A/dm^2$, for 30to 200 minutes, at a voltage which increases from approximately 25 to 30 V at the beginning of the treatment, to approximately 40 to 100 V toward the end of the treatment.

In addition to the processes for the anodic oxidation of support materials for printing plates, which already have been mentioned in the preceding paragraph, the following processes can, for example, also be used: the anodic oxidation of aluminum in an aqueous, $H_2SO_4$ containing electrolyte, in which the content of $Al^{3+}$ ions is adjusted to values exceeding 12 g/l (according to German Offenlegungsschrift No. 2,811,396, which is equivalent to U.S. Pat. No. 4,211,619), in an aqueous electrolyte containing $H_2SO_4$ and $H_3PO_4$ (according to German Offenlegungsschrift No. 2,707,810, which is equivalent to U.S. Pat. No. 4,049,504), or in an aqueous electrolyte containing $H_2SO_4$, $H_3PO_4$ and $Al^{3+}$ ions (according to German Offenlegungsschrift No. 2,836,803, which is equivalent to U.S. Pat. No. 4,229,266). Direct current is preferably used for the anodic oxidation, but it is also possible to use alternating current or a combination of these types of current (for example, direct current with superimposed alternating current). The layer weights of aluminum oxide range from 1 to 10 $g/m^2$, which correspond to thicknesses of the layers from about 0.3 to 3.0 $\mu$m.

The variant of the process of the invention which comprises the step of an anodic oxidation of the aluminum support material for printing plates is optionally followed by one or more post-treating steps. Post-treating is particularly understood as a hydrophilizing chemical, or electrochemical treatment of the aluminum oxide layer, for example, an immersion treatment of the material in an aqueous solution of polyvinyl phosphonic acid according to German Pat. No. 1,621,478 (equivalent to British Pat. No. 1,230,447), an immersion treatment in an aqueous solution of an alkali-metal silicate according to German Auslegeschrift No. 1,471,707 (equivalent to U.S. Pat. No. 3,181,461), or an electrochemical treatment (anodization) in an aqueous solution of an alkali metal silicate according to German Offenlegungsschrift No. 2,532,769 (equivalent to U.S. Pat. No. 3,902,976). These post-treatment steps serve, in particular, to improve even further the hydrophilic properties of the aluminum oxide layer, which are already sufficient for many fields of application, with the other well-known properties of the layer being at least maintained.

The object of the invention is further achieved by using the material according to the invention, which has been electrochemically roughened, cathodically modified and optionally anodically oxidized and additionally subjected to a hydrophilizing post-treatment, in manufacturing printing plates which carry radiation-sensitive coatings. For this purpose, the support material is coated with one of the following radiation-sensitive compositions, either by the manufacturer of presensitized printing plates or, in the process of coating a support material, by the user:

Suitable photosensitive coatings basically are any coatings which, after irradiation (exposure), optionally followed by development and/or fixing, yield a surface in image configuration, which can be used for printing.

In addition to the coatings which contain silver halides, and which are used in many fields, various other coatings are also known, such as are described, for example, in "Light-Sensitive Systems", by Jaromir Kosar, published by John Wiley & Sons, New York, 1965: the colloid coatings containing chromates and dichromates (Kosar, Chapter 2); the coatings containing unsaturated compounds, in which, upon exposure, these compounds are isomerized, rearranged, cyclized, or cross-linked (Kosar, Chapter 4); the coatings containing compounds which can be photopolymerized, in which, on being exposed, monomers or prepolymers undergo polymerization, optionally with the aid of an initiator (Kosar, Chapter 5); and the coatings containing o-diazoquinones, such as naphthoquinonediazides, p-diazoquinones, or condensation products of diazonium salts (Kosar, Chapter 7). The coatings which are suitable also include the electrophotographic coatings, i.e. coatings which contain an inorganic or organic photoconductor. In addition to the photosensitive substances, these coatings can, of course, also contain other constituents, such as for example, resins, dyes or plasticizers. In particular, the following photosensitive compositions or compounds can be employed in the coating of support materials prepared according to the process of the present invention:

Positive-working o-quinone diazide compounds, preferably o-naphthoquinone diazide compounds, which are described, for example, in German Pat. Nos. 854,890; 865,109; 879,203; 894,959; 938,233; 1,109,521; 1,144,705; 1,118,606; 1,120,273; and 1,124,817.

Negative-working condensation products from aromatic diazonium salts and compounds with active carbonyl groups, preferably condensation products formed from diphenylaminediazonium salts and formaldehyde, which are described, for example, in German Pat. Nos. 596,731; 1,138,399; 1,138,400; 1,138,401; 1,142,871; and 1,154,123; U.S. Pat. Nos. 2,679,498 and 3,050,502; and British Pat. No. 712,606.

Negative-working co-condensation products of aromatic diazonium compounds, for example, according to German Offenlegungsschrift No. 2,024,244.

Positive-working coatings according to German Offenlegungsschrift No. 2,610,842, German Pat. No. 2,718,254, or German Offenlegungsschrift No.

2,928,636, which contain a compound which, on being irradiated, splits-off an acid, a monomeric or polymeric compound which possesses at least one C—O—C group, which can be split-off by acid (e.g., an orthocarboxylic acid ester group, or a carboxamide-acetal group), and, if appropriate, a binder.

Negative-working coatings, composed of photopolymerizable monomers, photoinitiators, binders and, if appropriate, further additives. In these coatings, for example, acrylic and methacrylic acid esters, or reaction products of diisocyanates with partial esters of polyhydric alcohols are employed as monomers, as described, for example, in U.S. Pat. Nos. 2,760,863 and 3,060,023, and in German Offenlegungsschriften Nos. 2,064,079, and 2,361,041.

Negative-working coatings according to German Offenlegungsschrift No. 3,036,077, which contain, as the photosensitive compound, a diazonium salt polycondensation product, or an organic azido compound, and which contain, as the binder, a high molecular weight polymer with alkenylsulfonylurethane or cycloalkenylsulfonylurethane side groups.

It is also possible to apply photo-semiconducting coatings to the support materials manufactured according to the invention, such as are described, for example, in German Pat. Nos. 1,117,391; 1,522,497; 1,572,312; 2,322,046, and 2,322,047, as a result of which highly photosensitive electrophotographically-working printing plates are produced.

In the examples which follow, percentages are related to weight; parts by weight are related to parts by volume as the kg is related to the l. In the evaluation of the support materials manufactured according to the process of the invention, the following standard methods are used:

Determination of the Consumption of Dampening Solution

The amount of dampening solution applied is determined with the aid of an indicating device used in a dampening unit manufactured by Dahlgren. This indicating device does not provide an absolute measure of the consumption of dampening solution, however, the readings in scale units supplied by this device for various printing sequences can be compared with one another (relative measures).

Determination of the Resistance to Mechanical Abrasion

In order to define the abrasion behavior, printing forms manufactured from support materials which have been cathodically modified according to the process of the invention, are used for printing on a printing press, together with printing forms manufactured from support materials which have been roughened and anodized in a corresponding manner, without the application of this modifying step. The two types of plates are compared at particular intervals, with respect to adhesion of the coating and bright spots (indicating mechanical abrasion) in the non-image areas.

Determination of the Abrasive Removal of Material

The removal of material from the aluminum support resulting from cathodic modification, is determined by a gravimetric method. For this purpose, electrochemically roughened aluminum sheets, 100 mm × 100 mm in size, are weighed prior to the cathodic treatment. After carrying out the treatment of the invention, the samples are rinsed and dried and the removal of material is determined by re-weighing.

EXAMPLE 1 AND COMPARATIVE EXAMPLE 1

A 0.3 mm thick mill-finished aluminum foil is degreased and pre-pickled for 8 seconds at a temperature of about 80° C., in an aqueous solution containing NaOH and $Al^{3+}$ ions (used in the form of sodium aluminate). After an acidic intermediate washing (pickling), the surface of the aluminum foil is roughened in an aqueous solution containing $Al(NO_3)_3 \cdot 9H_2O$ and $HNO_3$, at a temperature from 40° to 45° C., under the action of alternating current at a current density of 45 $A/dm^2$ and with a strong bath circulation, until it has a peak-to-valley roughness $R_z$ of about 7 μm. After an intermediate washing with water, the aluminum foil, which is made the cathode, is treated in an aqueous electrolyte which contains 50 g/l of $NaNO_3$ and has a pH value of 6.8, for a duration of 30 seconds and at a temperature of 30° C., using direct current at a current density of 29 $A/dm^2$ and a voltage of 25 V; in the process, 2.28 $g/m^2$ of material are removed from the surface. After another intermediate washing, the aluminum foil is anodically oxidized in an aqueous anodizing bath containing $H_2SO_4$ and $Al^{3+}$ ions (used in the form of $Al_2(SO_4)_3$), for a duration of 25 seconds and at 40° C., under the action of direct current at a current density of 14 $A/dm^2$. Finally, the foil is washed with water and dried.

For manufacturing a presensitized printing plate from this material, which has been modified according to the invention, a positive-working radiation-sensitive coating is used, which has the following constituents:

6.00 parts by weight of a cresol/formaldehyde novolak (with softening range of 105° to 120° C., according to DIN 53 181),
1.10 parts by weight of 4-(2-phenyl-prop-2-yl)-phenyl-1,2-naphthoquinone-2-diazide-4-sulfonate,
0.81 part by weight of polyvinyl butyral, 0.75 part by weight of 1,2-naphthoquinone-2-diazide-4-sulfochloride,
0.08 part by weight of crystal violet,
91.36 parts by weight of a solvent mixture composed of 4 parts by volume of ethylene glycol monomethyl ether, 5 parts by volume of tetrahydrofuran, and 1 part by volume of butyl acetate.

The weight of the radiation-sensitive coating applied to the anodically oxidized support is about 3 $g/m^2$. The plate is exposed under an original using a 5 kW metal halide lamp and is developed with the following solution:

5.3 parts by weight of sodium metasilicate . 9 $H_2O$,
3.4 parts by weight of trisodium phosphate . 12 $H_2O$,
0.3 part by weight of sodium dihydrogen phosphate (anhydrous), and
91.0 parts by weight of water.

The printing form thus manufactured can be used for printing more than 200,000 good quality copies. It has an excellent printing behavior. Even if dampening solution is sparingly supplied, the plate does not tend to accept ink in the non-image areas ("scumming"). The consumption of dampening solution of the printing form is reduced by about 10 to 15%, as against a comparative printing form (C1), the support material of which is not subjected to a cathodically abrading treatment between the steps of roughening and anodically oxidizing, but which is, otherwise, of identical construction. In both printing forms, the reproduction coating is still in good condition after printing about 150,000 to 170,000 copies; however, the foil of the comparative example shows bright spots in the non-image areas, which indicates mechanical abrasion. As compared to this, the plate manufactured according to the invention does not show any signs of wear of the support material, even after printing 200,000 copies.

EXAMPLE 2 AND COMPARATIVE EXAMPLE C2

A 0.3 mm thick mill-finished aluminum foil is prepickled as specified in Example 1 and roughened in an aqueous solution containing $HNO_3/Al^{3+}$ ions, at a current density of 30 A/dm$^2$ and a temperature from 40° to 45° C., until it has a peak-to-valley roughness $R_z$ of about 4.5 μm. Cathodic treatment of the roughened aluminum substrate is carried out in an aqueous electrolyte which contains 50 g/l of NaCl, at a current density of 21 A/dm$^2$, a voltage of 15 V and a temperature of 30° C. After a treatment time of 20 seconds, a material removal of 1.05 g/m$^2$ is obtained. After pickling, the aluminum surface is anodically oxidized, as indicated in Example 1 and then subjected to a hydrophilizing treatment using an 0.2% concentration aqueous solution of polyvinyl phosphonic acid (molecular weight about 100,000) at 60° C., rinsed with water and dried. For manufacturing a presensitized printing plate, the aluminum sheet which has been prepared in this manner, is coated with the following negative-working radiation-sensitive coating:

0.70 part by weight of the polycondensation product of 1 mole of 3-methoxy-diphenylamine-4-diazonium sulfate and 1 mole of 4,4'-bis-methoxymethyl-diphenyl ether, precipitated as the mesitylene sulfonate, p0
3.40 parts by weight of 85% concentration $H_3PO_4$,
3.00 parts by weight of a modified epoxide resin, obtained by reacting 50 parts by weight of an epoxide resin having a molecular weight of less than 1,000 and 12.8 parts by weight of benzoic acid in ethylene glycol monomethyl ether, in the presence of benzyltrimethylammonium hydroxide,
0.44 part by weight of finely ground Heliogen Blue G (C.I. 74 100),
62.00 parts by volume of ethylene glycol monomethyl ether,
30.60 parts by volume of tetrahydrofuran, and
8.00 parts by volume of butyl acetate.

After exposure through an original, development is carried out with a solution of:

2.80 parts by weight of $Na_2SO_4 \cdot 10\ H_2O$,
2.80 parts by weight of $MgSO_4 \cdot 7\ H_2O$,
0.90 part by weight of 85% concentration $H_3PO_4$,
0.08 part by weight of $H_3PO_3$,
1.60 parts by weight of a non-ionic wetting agent,
10.00 parts by weight of benzyl alcohol,
20.00 parts by weight of n-propanol, and
60.00 parts by weight of water.

The printing form thus prepared yields more than 150,000 good quality prints on a sheet-fed offset press. Compared with a printing form (C2), which has been produced in a similar manner, without the cathodically abrading intermediate treatment of the invention, the printing form manufactured according to the present Example, consumes about 20% less dampening solution and does not show any signs of mechanical damage of the support surface in the non-image areas, even after printing 150,000 copies.

EXAMPLE 3 AND COMPARATIVE EXAMPLE C3

A 0.3 mm thick mill-finished aluminum foil is degreased and cleaned for 10 seconds at a temperature of about 80° C., using an aqueous solution containing NaOH. After rinsing with water, the foil is pickled in an acidic medium and is electrochemically roughened as specified in Example 1, until it has a peak-to-valley roughness $R_z$ of about 3 μm. This is followed by a cathodic treatment of the surface in an aqueous electrolyte which contains 50 g/l of $NaClO_3$. At a direct voltage of 25 V and a current density of 15 A/dm$^2$, about 0.9 g/m$^2$ of the aluminum surface are removed in 20 seconds. As a result, a surface is produced which has a very uniform roughening structure. Major cavities resulting from the electrochemical roughening step are almost entirely eliminated by the cathodic treatment according to the invention. The foil which has been washed, pickled in an acidic medium and re-washed, is provided with an oxide layer, which is anodically produced in sulfuric acid, as described in Example 2, and is post-treated with an aqueous solution of polyvinyl phosphonic acid; coating with a radiation-sensitive composition is carried out as indicated in Example 1. Compared with a plate (C3), which has been electrochemically roughened and anodically oxidized under identical conditions, without application of the intermediate treatment of the invention, about 7% less dampening solution is required by the printing form manufactured according to the present Example, to prevent the non-image areas from accepting ink ("scumming") during printing.

EXAMPLE 4

A support material which has been treated as indicated in Example 2 is used for manufacturing an electrophotographically-working offset printing plate, by coating it with the following radiation-sensitive solution:

10.00 parts by weight of 2,5-bis(4'-diethylaminophenyl)-1,3,4-oxadiazole,
10.00 parts by weight of a copolymer of styrene and maleic anhydride, which has a softening point of about 210° C.,
0.02 part by weight of Rhodamine FB (C.I. 45,170), and
300.00 parts by weight of ethylene glycol monomethyl ether.

The coating is negatively charged in the dark to about 400 V, with the aid of a corona and is exposed imagewise in a reprocamera and then developed (provided with toner) with an electrophotographic suspension developer, which is prepared by dispersing 3.0 parts by weight of magnesium sulfate in a solution of 7.5 parts by weight of a pentaerythritol resin ester in 1,200 parts by volume of an isoparaffin mixture having a boiling range from 185° to 210° C. After removing excess developer liquid, the developer is fixed and the plate is, for 60 seconds, dipped into a solution of:

35 parts by weight of sodium metasilicate . 9 $H_2O$,
140 parts by weight of glycerol,
560 parts by weight of ethylene glycol, and
140 parts by weight of ethanol.

The plate is then rinsed with a strong jet of water, thus removing those parts of the photoconductive layer which are not covered by toner. The plate is then ready for printing.

EXAMPLES 5 to 45

In these Examples, the values for the abrasive removal of material obtained by the cathodic modification according to the invention carried out in various aqueous electrolytes and under different conditions, are compiled in a tabular form. The starting material is an aluminum sheet which has been electrochemically roughened as indicated in Example 1.

TABLE (Values for the Abrasive Removal of Material by Cathodic Modification)

| | Aqueous Electrolyte | | | Process Conditions | | | Material |
|---|---|---|---|---|---|---|---|
| Example | Type of salt | Salt Concentr. (g/l) | pH-value | Voltage (V) | Current Density ($A/dm^2$) | Time (sec) | Removed ($g/m^2$) |
| 5 | $NaNO_3$ | 5 | 6.4 | 40 | 5 | 90 | 0.68 |
| 6 | " | 5 | 6.4 | 60 | 9 | 60 | 0.90 |
| 7 | " | 10 | 6.6 | 60 | 17 | 30 | 1.25 |
| 8 | " | 20 | 6.8 | 25 | 10 | 20 | 0.55 |
| 9 | " | 20 | 6.8 | 25 | 10 | 30 | 0.78 |
| 10 | " | 20 | 6.8 | 25 | 10 | 60 | 1.25 |
| 11 | " | 20 | 6.8 | 40 | 18 | 30 | 1.07 |
| 12 | " | 50 | 6.9 | 25 | 24 | 20 | 0.81 |
| 13 | " | 50 | 6.9 | 30 | 38 | 20 | 1.64 |
| 14 | " | 50 | 6.9 | 40 | 60 | 10 | 1.41 |
| 15 | " | 50 | 6.9 | 50 | 80 | 10 | 3.00 |
| 16 | " | 100 | 7.3 | 25 | 35 | 20 | 1.69 |
| 17 | " | 100 | 7.3 | 30 | 45 | 20 | 2.40 |
| 18 | " | 100 | 7.3 | 40 | 65 | 20 | 3.92 |
| 19 | " | 250 | 8.2 | 15 | 30 | 20 | 1.19 |
| 20 | " | 250 | 8.2 | 20 | 45 | 30 | 4.10 |
| 21 | " | 250 | 8.2 | 30 | 85 | 10 | 3.21 |
| 22 | NaCl | 5 | 6.3 | 50 | 11 | 30 | 0.42 |
| 23 | " | 10 | 6.9 | 40 | 16 | 30 | 0.73 |
| 24 | " | 20 | 7.2 | 25 | 19 | 30 | 1.30 |
| 25 | " | 20 | 7.2 | 30 | 24 | 30 | 1.71 |
| 26 | " | 20 | 7.2 | 40 | 35 | 20 | 1.52 |
| 27 | " | 20 | 7.2 | 50 | 48 | 30 | 4.24 |
| 28 | " | 20 | 7.2 | 60 | 65 | 20 | 3.73 |
| 29 | " | 50 | 7.6 | 20 | 25 | 30 | 1.14 |
| 30 | " | 50 | 7.6 | 30 | 45 | 30 | 3.87 |
| 31 | " | 50 | 7.6 | 40 | 68 | 30 | 6.04 |
| 32 | " | 50 | 7.6 | 50 | 100 | 10 | 3.74 |
| 33 | " | 100 | 8.1 | 10 | 15 | 30 | 0.68 |
| 34 | " | 100 | 8.1 | 15 | 30 | 30 | 1.87 |
| 35 | " | 100 | 8.1 | 20 | 44 | 20 | 1.63 |
| 36 | " | 100 | 8.1 | 20 | 44 | 30 | 3.68 |
| 37 | " | 100 | 8.1 | 30 | 70 | 10 | 2.73 |
| 38 | " | 250 | 8.5 | 10 | 28 | 30 | 2.12 |
| 39 | " | 250 | 8.5 | 20 | 80 | 10 | 3.03 |
| 40 | $NaClO_3$ | 50 | 7.4 | 30 | 20 | 30 | 1.32 |
| 41 | $NaHSO_4$ | 50 | 6.5 | 20 | 16 | 30 | 0.87 |
| 42 | $NaH_2PO_4$ | 50 | 7.6 | 20 | 10 | 30 | 0.57 |
| 43 | $Na_2B_4O_7$ | 50 | 9.3 | 50 | 15 | 30 | 0.62 |
| 44 | $NaBF_4$ | 50 | 3.8 | 30 | 22 | 20 | 1.49 |
| 45 | $NaSiF_6$ | 20 | 3.5 | 40 | 8 | 60 | 0.65 |

It will be obvious to those skilled in the art that many modifications may be made within the scope of the present invention without departing from the spirit thereof, and the invention includes all such modifications.

What is claimed is:

1. A process for electrochemically modifying at least one surface of electrochemically roughened aluminum or aluminum alloy-based support materials for printing plates in an aqueous electrolyte, comprising the steps of:
(a) using alternating current to electrochemically roughen an aluminum or aluminum alloy-based support in an aqueous electrolyte containing at least one from the group consisting of hydrochloric acid and nitric acid, and
(b) after step (a), subjecting said support as a cathode to direct current in an aqueous electrolyte which has a pH value in the range of 3 to 11 and which consists essentially of at least one water-soluble salt selected from the group consisting of an alkali metal salt and an alkaline earth metal salt of:
(i) a hydrohalogenic acid,
(ii) an oxo-acid or halogen, carbon, boron, nitrogen or sulfur, or
(iii) a fluorine-containing acid of boron, silicon or sulfur, said water-soluble salt being present in a concentration ranging from about 5 g/l up to the saturation limit of said salt, so as to electrochemically remove from the surface of said support an amount of material ranging between about 0.1 and about 10 $g/m^2$.

2. A process as claimed in claim 1, wherein said aqueous electrolyte in step (b) has a pH value in the range of 5 to 9.

3. A process as claimed in claim 1, wherein said amount of material electrochemically removed from the surface of said support ranges from about 0.5 to about 5 $g/m^2$.

4. A process as claimed in claim 1, wherein said aqueous electrolyte in step (b) conains between about 10 and about 250 g/l of said water-soluble salt.

5. A process as claimed in claim 1, wherein step (b) is carried out using direct current at a current density from 3 to 100 $A/dm^2$, at a temperature from 15° to 90° C., and for a duration of 5 to 90 seconds.

6. A process as claimed in claim 1, wherein step (b) is carried out at a current density ranging between about 10 and about 80 $A/dm^2$, at a temperature of about 20° to 40° C., and for a duration of about 10 to about 60 seconds.

7. A process as claimed in claim 1, wherein the support is anodically oxidized, in an aqueous electrolyte containing sulfuric acid and/or phosphoric acid, using direct current, after step (b).

8. A process as claimed in claim 7, wherein the anodically oxidized support materials for printing plates are subjected to a hydrophilizing post-treatment.

9. A process as claimed in claim 1, wherein the mean peak-to-valley roughness of said support after electrochemical roughening during step (a) is in the range of from about 1 to about 15 μm.

10. An offset printing plate comprising:
(a) a support material produced by:
(i) electrochemically roughening an aluminum or aluminum alloy-based support using alternating current in an aqueous electrolyte containing at least one from the group consisting of hydrochloric acid and nitric acid; and, thereafter,
(i) subjecting said support as a cathode to direct current in an aqueous electrolyte which has a pH value in the range of 3 to 11 and which consists essentially of at least one water-soluble salt selected from the group consisting of an alkali metal salt and an alkaline earth metal salt of (i) a hydrohalogenic acid, (ii) an oxo-acid of halogen, carbon, boron, nitrogen or sulfur, or (iii) a fluorine-containing acid of boron, silicon or sulfur, said water-soluble salt being present in a concentration ranging from about 5 g/l up to the saturation limit of said salt, so as to electrochemically remove from the surface of said support an amount of material ranging between about 0.1 and about 10 g/m$^2$; and (b) a radiation-sensitive coating on said support material.

* * * * *

UNITED STATES PATENT AND TRADEMARK OFFICE

CERTIFICATE OF CORRECTION

PATENT NO. : 4,482,444

DATED : November 13, 1984

INVENTOR(S) : Werner FRASS and Dieter MOHR

It is certified that error appears in the above—identified patent and that said Letters Patent is hereby corrected as shown below:

IN THE BIBLIOGRAPHICAL DATA:

At item [30] Foreign Application Priority Data should read -- June 19, 1982 -- instead of "1980".

IN THE CLAIMS:

Claim 1, line 15, "an oxo-acid or halogen" should read -- an oxo-acid of halogen.

Claim 4, line 33, "conains" should read -- contains --.

Claim 6, line 41, after "to" insert -- about --.

Claim 10, line 62, delete (i) and insert -- (ii) --.

Signed and Sealed this

*Twenty-third* Day of *April 1985*

[SEAL]

*Attest:*

DONALD J. QUIGG

*Attesting Officer* *Acting Commissioner of Patents and Trademarks*